United States Patent
Chi et al.

(10) Patent No.: US 9,667,261 B2
(45) Date of Patent: May 30, 2017

(54) INTEGRATED CIRCUIT AND CLOCK DATA RECOVERY CIRCUIT

(71) Applicant: SK hynix Inc., Gyeonggi-do (KR)

(72) Inventors: Han-Kyu Chi, Gyeonggi-do (KR); Taek-Sang Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/934,410

(22) Filed: Nov. 6, 2015

(65) Prior Publication Data
US 2016/0352343 A1 Dec. 1, 2016

(30) Foreign Application Priority Data
Jun. 1, 2015 (KR) .................. 10-2015-0077168

(51) Int. Cl.

| | |
|---|---|
| H03L 7/06 | (2006.01) |
| H04L 7/033 | (2006.01) |
| H03L 7/08 | (2006.01) |
| H03L 7/089 | (2006.01) |
| H04L 7/00 | (2006.01) |
| H03L 7/081 | (2006.01) |
| H03L 7/093 | (2006.01) |

(52) U.S. Cl.
CPC ............ *H03L 7/0807* (2013.01); *H03L 7/089* (2013.01); *H03L 7/0814* (2013.01); *H03L 7/093* (2013.01); *H04L 7/0025* (2013.01); *H04L 7/033* (2013.01); *H04L 7/0337* (2013.01)

(58) Field of Classification Search
CPC ..... H04L 7/033; H04L 7/0331; H04L 7/0025; H04L 7/0337; H03L 7/089; H03L 7/10; H03L 7/0807; H03L 7/085; H03L 7/0814; H03L 7/093
See application file for complete search history.

(56) References Cited

U.S. PATENT DOCUMENTS

| | | | |
|---|---|---|---|
| 6,754,158 B1 * | 6/2004 | Kobayashi | ............... G11B 5/00 |
| | | | 369/47.51 |
| 7,474,720 B2 * | 1/2009 | Yuuki | ................... H03L 7/0814 |
| | | | 370/503 |

(Continued)

FOREIGN PATENT DOCUMENTS

KR 101202084 11/2012

OTHER PUBLICATIONS

Hidaka, Y., et al., A 4-Channel 3.1110.3Gb/s Transceiver Macro with a Pattern-Tolerant Adaptive Equalizer, 2007 IEEE International Solid-State Circuits Conference, 2007, pp. 442-443.

*Primary Examiner* — Michelle M Koeth
(74) *Attorney, Agent, or Firm* — IP & T Group LLP

(57) ABSTRACT

An integrated circuit includes a comparator capable of generating an up/down signal by comparing a feedback signal with a reference signal; a restoration signal generation unit capable of enabling a restoration signal when the up/down signal maintains an identical value for greater than or equal to a first specific time and changes afterwards; a processing circuit including one or more stages for sequentially processing the up/down signal, wherein a last one of the one or more stages holds a process result thereof for a second specific time when the restoration signal is enabled; and a feedback unit capable of generating the feedback signal in response to the process result of the last stage.

6 Claims, 9 Drawing Sheets

(56) References Cited

U.S. PATENT DOCUMENTS

2009/0154315 A1* 6/2009 Miyashita ............ G11B 7/0062
  369/47.5
2014/0126678 A1 5/2014 Cirit et al.

* cited by examiner

FIG. 9

| CYCLES | UP/DN | OUTPUT (C) OF FIRST STAGE | OUTPUT (F) OF SECOND STAGE | OUTPUT (CODE<0:N>) OF THIRD STAGE |
|---|---|---|---|---|
| 1CYCLES | UP | +11 | 0 | CODE VALUE CORRESPONDING TO 0 |
| 2CYCLES | UP | +12 | +11 | CODE VALUE CORRESPONDING TO 0 |
| 3CYCLES | UP | +13 | +23 | CODE VALUE CORRESPONDING TO +11 |
| 4CYCLES | UP | +14 | +36 | CODE VALUE CORRESPONDING TO +23 |
| 5CYCLES | DN | -7 | +23 | CODE VALUE CORRESPONDING TO +23 ← ACTIVATE RESTORE |
| 6CYCLES | DN | -8 | +16 | CODE VALUE CORRESPONDING TO +23 |

FIG. 12

| | UP/DN | OUTPUT (C) OF FIRST STAGE | OUTPUT (F) OF SECOND STAGE | OUTPUT (CODE<0:N>) OF THIRD STAGE |
|---|---|---|---|---|
| 1CYCLES | UP | +11 | 0 | CODE VALUE CORRESPONDING TO 0 |
| 2CYCLES | UP | +12 | +11 | CODE VALUE CORRESPONDING TO 0 |
| 3CYCLES | UP | +13 | +23 | CODE VALUE CORRESPONDING TO +11 |
| 4CYCLES | UP | +14 | +36 | CODE VALUE CORRESPONDING TO +23 |
| 5CYCLES | DN | -7 | 0 | CODE VALUE CORRESPONDING TO +11 |
| 6CYCLES | DN | -8 | -7 | CODE VALUE CORRESPONDING TO 0 |

ACTIVATE RESTORE

INTEGRATED CIRCUIT AND CLOCK DATA RECOVERY CIRCUIT

CROSS-REFERENCE TO RELATED APPLICATION(S)

The present application claims priority of Korean Patent Application No. 10-2015-0077168, filed on Jun. 1, 2015, which is incorporated herein by reference in its entirety.

BACKGROUND

1. Field

Exemplary embodiments of the present invention relate to an integrated circuit and a clock data recovery circuit, and more particularly, to a technology for reducing bang-bang errors.

2. Description of the Related Art

Bang-bang errors often occur in comparators and feedback-based integrated circuits that process comparator results and feed the processed results back.

FIG. 1 is a diagram illustrating a feedback-based integrated circuit.

Referring to FIG. 1, the integrated circuit includes a comparator 110, a processing circuit 120, and a feedback unit 130.

The comparator 110 generates an up/down signal UP/DN by comparing a feedback signal FB with a reference signal REF.

The comparator 110 generates an up/down signal UP/DN by comparing voltage levels or phases of the feedback signal FB and that of the reference signal REF.

The processing circuit 120 processes the up/down signal UP/DN and transfers the processed signal to the feedback unit 130. The processing circuit 120 may perform a variety of types of processing, such as filtering noise or converting up/down signals UP/DN into a signal recognizable to the feedback unit 130.

The feedback unit 130 generates the feedback signal FB based on the processed signal of the processing circuit 120. When the up/down signal UP/DN of the comparator 110 is indicative of an up signal, the feedback unit 130 may make the feedback signal FB up based on the processed signal of the processing of the processing circuit 120. When the up/down signal UP/DN is indicative of a down signal, the feedback unit 130 may make the feedback signal FB down based on the processed signal of the processing of the processing circuit 120. The feedback signal FB is the final output value of the integrated circuit and is also fed back to the comparator 110 again.

Many integrated circuits can have the feedback structure described above. For example, a phase locked loop (PLL), a delay locked loop (DLL), and a clock data recovery (CDR) circuit may have such a feedback structure.

As is well known, a PLL includes a phase detector, a loop filter, and a voltage-controlled oscillator. The phase detector corresponds to the comparator 110, the loop filter corresponds to the processing circuit 120, and the voltage-controlled oscillator corresponds to the feedback unit 130. Furthermore, the DLL includes a phase detector, a delay control circuit, a delay circuit, and a replica delay circuit. The phase detector corresponds to the comparator 110, the delay control circuit corresponds to the processing circuit 120, and the delay circuit and the replica delay circuit correspond to the feedback unit 130. Furthermore, the CDR circuit includes a phase detector, a processing circuit such as a filter, and a phase interpolator. The phase detector corresponds to the comparator 110, the processing circuit such as the filter corresponds to the processing circuit 120, and the phase interpolator may correspond to the feedback unit 130.

That is, the integrated circuit of FIG. 1 does not illustrate a specific circuit, but a general circuit having the feedback scheme.

FIG. 2 is a diagram illustrating a bang-bang error generated in the integrated circuit of FIG. 1.

In FIG. 2, "UP" is indicative of the up signal of the up/down signal UP/DN provided from the comparator 110, and "DN" is indicative of the down signal of the up/down signal UP/DN provided from the comparator 110. In this patent document, 5 cycles are taken as an example for the processing circuit 120 to process the up/down signal UP/DN and to transfer the processed signal to the feedback unit 130. That is, it takes 5 cycles for a result of the comparison of the comparator 110 to be incorporated into the feedback signal FB.

For example, referring to FIG. 2, the voltage level of the feedback signal FB is lower than that of the reference signal REF for 4 cycles from a time point 201. Accordingly, the up/down signal UP/DN of the comparator 110 is indicative of the up signal requiring a rise in the voltage level of the feedback signal FB.

The voltage level of the feedback signal FB becomes higher than that of the reference signal REF from a time point 202. Accordingly, the up/down signal UP/DN of the comparator 110 is indicative of the down signal requiring drop in the voltage level of the feedback signal FB. The voltage level of the feedback signal FB is supposed to be lowered from the time point 202 at which the up/down signal UP/DN is indicative of the down signal. However, the voltage level of the feedback signal FB starts lowering at time point 203 because it takes 5 cycles for the down signal at the time point 202 to be incorporated into the feedback signal FB.

For example, the voltage level of the feedback signal FB becomes lower than that of the reference signal REF from a time point 204. Accordingly the up/down signal UP/DN of the comparator 110 is indicative of the up signal requiring rise in the voltage level of the feedback signal FB. The voltage level of the feedback signal FB is supposed to be raised from the time point 204 at which the up/down signal UP/DN is indicative of the up signal. However, the voltage level of the feedback signal FB starts rising at a time point 205 because it takes 5 cycles for the up signal at the time point 204 to be incorporated into the feedback signal FB.

As described above, the bang-bang error is generated due to the time taken for the comparison result UP/DN of the comparator 110 to be incorporated into the feedback signal FB. In FIG. 2, reference number "210" is indicative of the size of the bang-bang error.

A bang-bang error is generated in almost all the integrated circuits having the feedback structure. In order to improve accuracy in the operation of an integrated circuit, it is very important to reduce bang-bang errors.

SUMMARY

Various embodiments are directed to an integrated circuit having reduced bang-bang errors.

In an embodiment, an integrated circuit may include a comparator capable of generating an up/down signal by comparing a feedback signal with a reference signal; a restoration signal generation unit capable of enabling a restoration signal when the up/down signal maintains an identical value for greater than or equal to a first specific time and changes afterwards; a processing circuit including one or more stages for sequentially processing the up/down signal, wherein a last one of the one or more stages holds a process result thereof for a second specific time when the restoration signal is enabled; and a feedback unit capable of generating the feedback signal in response to the process result of the last stage.

In an embodiment, an integrated circuit may include a comparator capable of generating an up/down signal by comparing a feedback signal with a reference signal; a restoration signal generation unit capable of enabling a restoration signal when the up/down signal maintains an identical value for greater than or equal to a specific time and changes afterwards; a processing circuit including one or more stages for sequentially processing the up/down signal, wherein a last one of the one or more stages restores a process result thereof to a previous value when the restoration signal is enabled; and a feedback unit capable of generating the feedback signal in response to the process result of the last stage.

Furthermore, in an embodiment, a clock data recovery circuit may include a phase comparator capable of generating an up/down signal by comparing a phase of a recovered clock with a phase of received data; a restoration signal generation unit capable of enabling a restoration signal when the up/down signal maintains an identical value for greater than or equal to a first specific time and changes afterwards; a processing circuit including one or more stages for sequentially processing the up/down signal, wherein a last one of the one or more stages holds a process result thereof for a second specific time when the restoration signal is enabled; and a phase interpolator capable of generating the recovered clock in response to the process result of the last stage.

The processing circuit includes a first stage including: a non-accumulation path capable of generating a non-accumulation value in response to the up/down signal, an accumulation path capable of generating an accumulation value in response to the up/down signal, and an adder capable of outputting an added value of the non-accumulation value and the accumulation value; a second stage capable of accumulating the added value and outputting the accumulated value as a result value; and a third stage capable of generating control code for controlling the phase interpolator so that to the phase interpolator generates the recovered clock having a phase corresponding to the result value of the second stage.

The second stage may change the result value to a value prior to 2 cycles prior when the restoration signal is enabled. The third stage may hold the control code when the restoration signal is enabled.

In an embodiment, a clock data recovery circuit may include a phase comparator capable of generating an up/down signal by comparing a phase of a recovered clock with a phase of received data; a restoration signal generation unit capable of enabling a restoration signal when the up/down signal maintains an identical value for greater than or equal to a specific time and changes afterwards; a processing circuit including one or more stages for sequentially processing the up/down signal, wherein a last one of the one or more stages restores a process result thereof to a previous value when the restoration signal is enabled; and a phase interpolator capable of generating the recovered clock in response to the process result of the last stage.

The processing circuit may include a first stage including: a non-accumulation path capable of generating a non-accumulation value in response to the up/down signal, an accumulation path capable of generating an accumulation value in response to the up/down signal, and an adder capable of outputting an added value of the non-accumulation value and the accumulation value; a second to stage capable of accumulating the added value and outputting the accumulated value as a result value; and a third stage capable of generating control code for controlling the phase interpolator so that the phase interpolator generates the recovered clock having a phase corresponding to the result value of the second stage.

The second stage may change the result value to a value prior to 2 cycles when the restoration signal is enabled. The third stage may change the control code into a value prior to two cycles when the restoration signal is enabled.

BRIEF DESCRIPTION OF THE DRAWINGS

FIG. 9 is a diagram illustrating an entire operation of the processing circuit shown in FIGS. 6 to 8.

FIG. 12 is a diagram illustrating the entire operation of the processing circuit shown in FIGS. 10 to 11.

DETAILED DESCRIPTION

Figure 1:
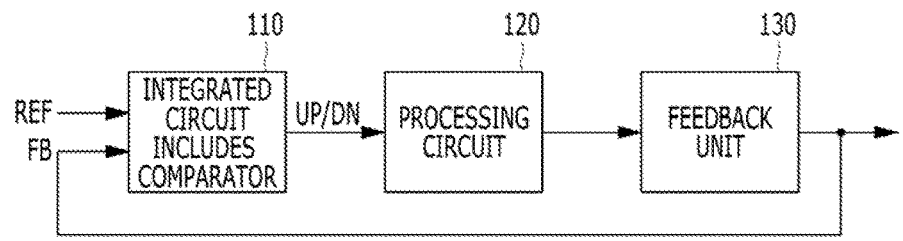
FIG. 1 is a diagram illustrating a feedback-based integrated circuit.
Figure 2:
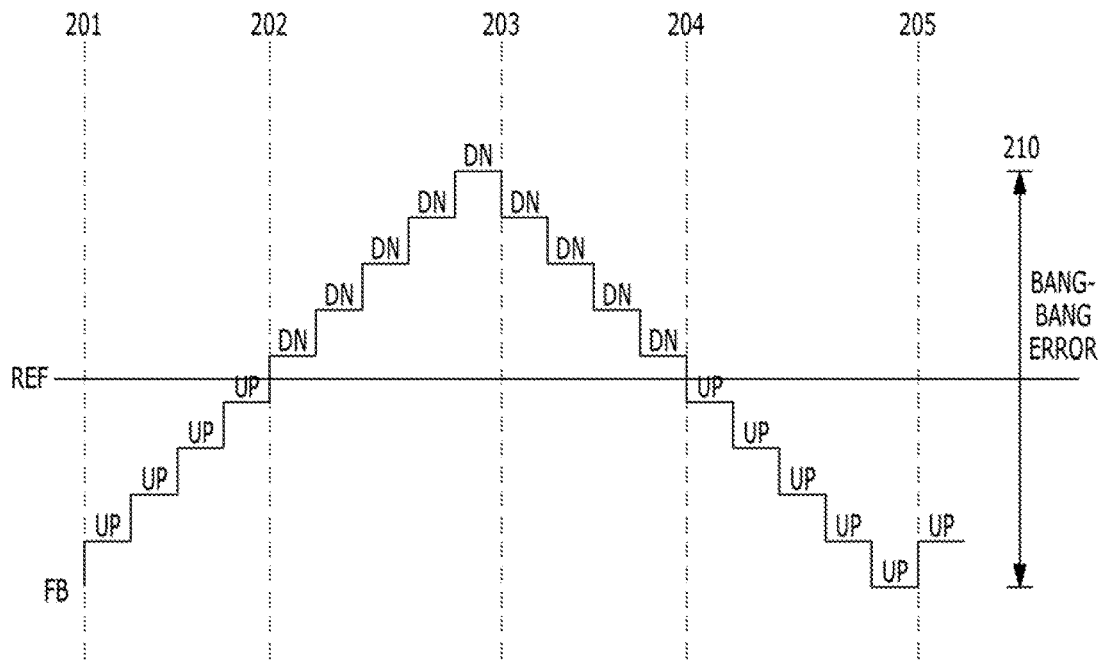
FIG. 2 is a diagram exemplarily illustrating a bang-bang error generated in the integrated circuit of FIG. 1.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
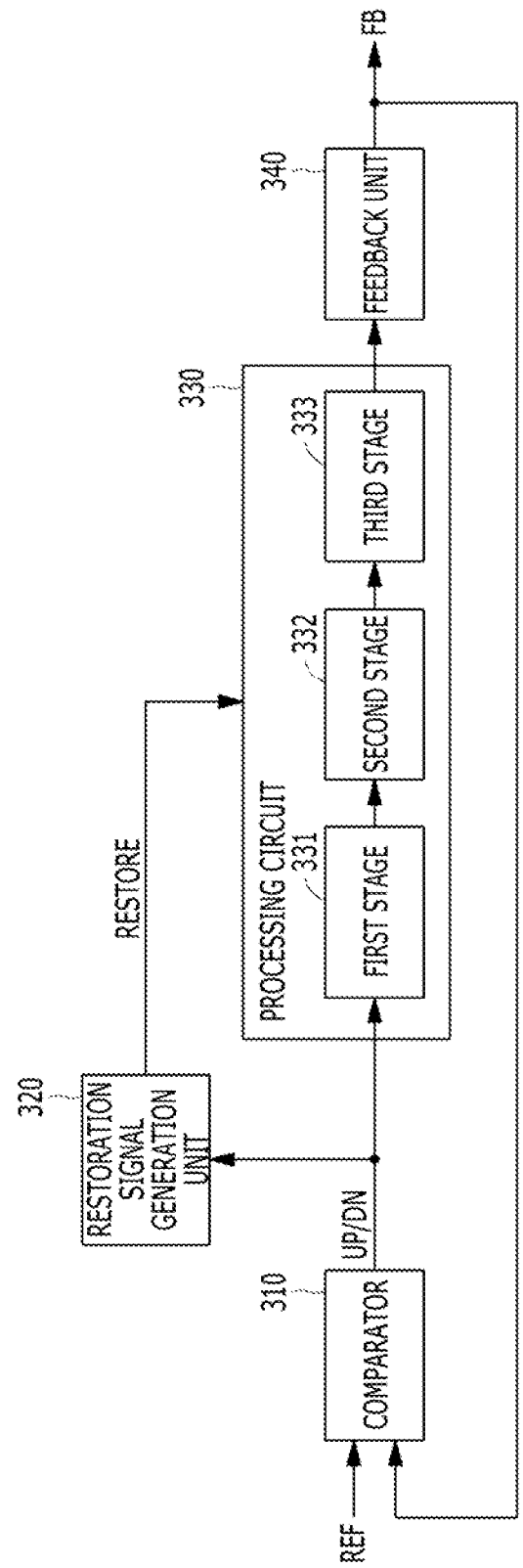
FIG. 3 is a diagram illustrating a feedback-based integrated circuit in accordance with an embodiment of the present invention.

FIG. 3 is a diagram illustrating a feedback-based integrated circuit in accordance with an embodiment of the present invention.

Referring to FIG. 3, the integrated circuit may include a comparator 310, a restoration signal generation unit 320, a processing circuit 330, and a feedback unit 340.

The comparator 110 may generate an up/down signal UP/DN by comparing a reference signal REF with a feedback signal FB. The comparator 110 may compare voltage levels or phases of the feedback signal FB and that of the reference signal REF. FIG. 3 exemplarily shows the up/down signal UP/DN as a single signal, but the up/down signal UP/DN may include up and down signals.

The restoration signal generation unit 320 may enable a restoration signal RESTORE when the up/down signal UP/DN maintains the same value for greater than or equal to a specific time and changes. For example, when the up/down signal UP/DN keeps the same value four times and changes ("UP"→"UP"→"UP"→"UP"→"DN" or "DN"→"DN"→"DN"→"DN"→"UP"), the restoration signal generation unit 320 may enable the restoration signal RESTORE. When the up/down signal UP/DN maintains the same value for greater than or equal to a specific time and changes, there is a good possibility that a bang-bang error may occur in the integrated circuit. The restoration signal RESTORE may represent notification of the possibility of the bang-bang error.

The processing circuit 330 may include one or more stages 331 to 333 configured to sequentially process the up/down signal UP/DN. The stages 331 to 333 of the processing circuit 330 may perform various processing operations for incorporating the up/down signal UP/DN into the feedback signal FB of the feedback unit 340, such as filtering noise, accumulating noise filtering results, or changing the format of signals. FIG. 3 shows the processing circuit 330 exemplarily having the three stages 331 to 333, a number of which may vary.

The feedback unit 340 may generate the feedback signal FB in response to a process result of the processing circuit 330. When the up/down signal UP/DN of the comparator 310 is indicative of the up signal, the up/down signal UP/DN may be processed by the processing circuit 330 and incorporated into the feedback signal FB of the feedback unit 340 so that a voltage level of the feedback signal FB is raised. When the up/down signal UP/DN of the comparator 310 is indicative of the down signal, the up/down signal UP/DN may be processed by the processing circuit 330 and incorporated into the feedback signal FB of the feedback unit 340 so that a voltage level of the feedback signal FB is lowered down.

The processing circuit 330 may perform an operation for reducing the bang-bang error in response to the enablement of the restoration signal RESTORE. The processing circuit 330 may respond to the restoration signal RESTORE in two ways as follows.

(1) Hold of a Process Result

When the restoration signal RESTORE is enabled, a process result of the processing circuit 330, that is, a process result of the last stage 333, may be held for a specific time. The processing circuit 330 may keep the process result without change. When the processing circuit 330 continues to operate in the same way even after the restoration signal RESTORE is enabled, the processing circuit 330 may operate in such a way as to increase an error of the feedback signal FB. An increase in the error of the feedback signal FB can be prevented because a process result of the processing circuit 330 is held for a specific time. For example, when the processing circuit 330 continues to operate in the same way although the up/down signal UP/DN of the comparator 310 keeps the same value four times (for example, "UP"→"UP"→"UP"→"UP"→"DN") and thus the restoration signal RESTORE is enabled, although the up/down signal UP/DN is indicative of the down signal, the processing circuit 330 may erroneously control the feedback unit 340 to continue to raise the voltage level of the feedback signal FB due to the latency of the processing circuit 330 in such a way as to increase the error of the feedback signal FB. However, when a process result of the processing circuit 330 is held in response to the enabled restoration signal RESTORE, an increase in errors of the feedback signal FB can be prevented.

(2) Restoration of the Previous Process Result

When the restoration signal RESTORE is enabled, the process result of the processing circuit 330 may be restored to a previous value. An increase in errors of the feedback signal FB can be prevented, and errors can be reduced by restoring a process result of the processing circuit 330 to the previous value. For example, when the processing circuit 330 restores the process result to the previous value when the up/down signal UP/DN of the comparator 310 keeps the same value four times (for example, "UP"→"UP"→"UP"→"UP"→"DN") and thus the restoration signal RESTORE is enabled, errors of the feedback signal FB can be reduced because the same effect as the feedback unit 340 lowers the voltage level of the feedback signal FB is obtained.

Many types of integrated circuit have feedback structures as described above. For example, a PLL, a DLL, and a CDR circuit may have this sort of feedback structure.

As is well known, the PLL includes a phase detector, a loop filter, and a voltage-controlled oscillator. The phase detector may correspond to the comparator 310, the loop filter may correspond to the processing circuit 330, and the voltage-controlled oscillator may correspond to the feedback unit 340. Furthermore, the DLL includes a phase detector, a delay control circuit, a delay circuit, and a replica delay circuit. The phase detector may correspond to the comparator 310, the delay control circuit may correspond to the processing circuit 330, and the delay circuit and the replica delay circuit may correspond to the feedback unit 340. Furthermore, the CDR circuit includes a phase detector, a processing circuit, such as a filter, and a phase interpolator. The phase detector may correspond to the comparator 310, the processing circuit, such as a filter, may correspond to the processing circuit 330, and the phase interpolator may correspond to the feedback unit 340.

That is, the integrated circuit of FIG. 3 does not illustrate a specific circuit, but a general circuit having a feedback scheme. The holding of the process result and the restoration of the previous process result described above for reducing bang-bang errors through the restoration signal RESTORE may be applied to various types of circuits.

Figure 4:
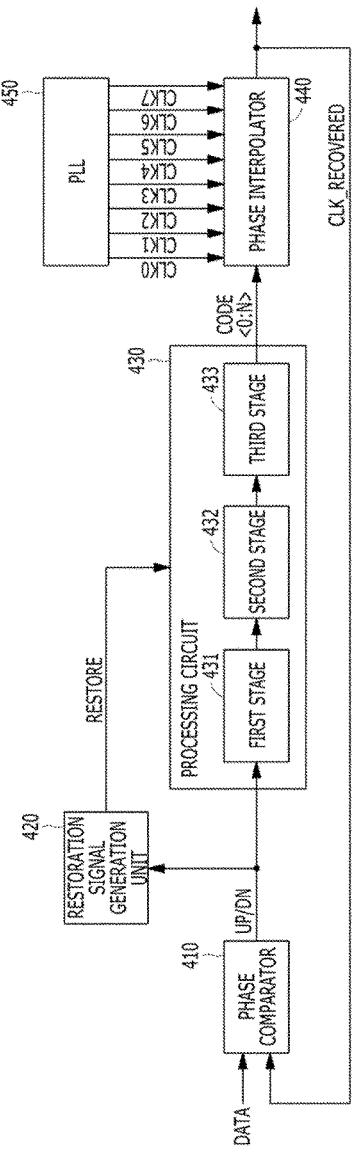
FIG. 4 is a diagram illustrating a dock data recovery (CDR) circuit in an applied example of the integrated circuit of FIG. 3.

FIG. 4 is a diagram illustrating a clock data recovery (CDR) circuit as an applied example of the integrated circuit of FIG. 3.

Referring to FIG. 4 the CDR may include a phase comparator 410, a restoration signal generation unit 420, a processing circuit 430, and a phase interpolator 440. Furthermore, the phase interpolator 440 may include a PLL 450 configured to supply multi-phase clocks CLK0 to CLK7.

The phase comparator 410 may generate an up/down signal UP/DN indicative of a relative phase between received data DATA and a recovered clock CLK_RECOVERED by comparing the phases of the received data DATA and the recovered clock CLK_RECOVERED. The phase comparator 410 may correspond to the comparator 310 of the integrated circuit of FIG. 3.

The restoration signal generation unit 420 may enable a restoration signal RESTORE when the up/down signal UP/DN maintains the same value for greater than or equal to a specific time and changes. For example, when the up down signal UP/DN keeps the same value four times and changes ("UP"→"UP"→"UP"→"UP"→"DN" or "DN"→"DN"→"DN"→"DN"→"UP"), the restoration signal generation unit 420 may enable the restoration signal RESTORE. When the up/down signal UP/DN maintains the same value for greater than or equal to a specific time and changes, there is a good possibility that the bang-bang error may occur in the CDR. The restoration signal RESTORE may represent notification of the good possibility of the bang-bang error. The restoration signal generation unit 420 may correspond to the restoration signal generation unit 320 of the integrated circuit of FIG. 3.

The processing circuit 430 may include one or more stages 431 to 433 configured to sequentially process the up/down signal UP/DN. FIG. 4 shows the processing circuit 430 exemplarily having the three stages 431 to 433, a number of which may vary. The first stage 431 may filter a noise of the up/down signal UP/DN. The second stage 432 may accumulate a result of the filtering of the first stage 431. The third stage 433 may generate control code CODE<0:N> for controlling the phase interpolator 440 so that the phase interpolator 440 generates the recovered clock CLK_RECOVERED having a phase corresponding to a result value of the second stage 432.

The phase interpolator 440 may generate the recovered clock CLK_RECOVERED in response to the control code CODE<0:N>. The phase interpolator 440 may generate the recovered clock CLK_RECOVERED by composing two of the multi-phase clocks CLK0 to CLK7 supplied by the PLL 450. The control code CODE<0:N> may include information about clocks to be composed by the phase interpolator 440 among the multi-phase clocks CLK0 to CLK7, and information about a composite ratio. The multi-phase clocks CLK0 to CLK7 supplied by the PLL 450 may have different phases. For example, a K-th clock CLKK may have a phase difference of 45° from a (K−1)th clock CLKK−1 among the multi-phase clocks CLK0 to CLK7. The edge of the recovered clock CLK_RECOVERED may be aligned to the center of the received data DATA, and the recovered clock CLK_RECOVERED may be used to accurately receive the received data DATA.

The processing circuit 430 may perform an operation for reducing bang-bang errors in response to the enablement of the restoration signal RESTORE. The processing circuit 430 may respond to the restoration signal RESTORE in two ways as follows.

(1) Hold of a Process Result

When the restoration signal RESTORE is enabled, the process result of the processing circuit 430, that is, the control code CODE<0:N> may be held for a specific time. The processing circuit 430 may keep a value of the control code CODE<0:N> without changing. An increase in the error of the recovered clock CLK_RECOVERED can be prevented by holding the value of the control code CODE<0:N> provided from the processing circuit 430 for a specific time. For example, when the up/down signal UP/DN of the phase comparator 410 keeps the same value four times (for example, "UP"→"UP"→"UP"→"UP"→"DN") and thus the restoration signal RESTORE is enabled, the value of the control code CODE<0: N> of the processing circuit 430 may be held in response to the enabled restoration signal RESTORE and thus an increase in errors of the recovered clock CLK_RECOVERED can be prevented.

(2) Restoration of the Previous Process Result

When the restoration signal RESTORE is enabled, the process result of the processing circuit 430, that is, the control code CODE<0:N> may be restored to a previous value. An increase in errors of the recovered clock CLK_RECOVERED can be prevented, and errors can be reduced by restoring the control code CODE<0:N> that is, the process result of the processing circuit 430, to the previous value. For example, when the processing circuit 430 restores the value of the control code CODE<0:N> to the previous value when the up/down signal UP/DN of the phase comparator 410 keeps the same value four times (for example, "UP"→"UP"→"UP"→"UP"→"DN") and thus the restoration signal RESTORE is enabled, the phase of the recovered clock CLK_RECOVERED can immediately lag and an error in the phase of the recovered clock CLK_RECOVERED can be reduced because the same effect as the feedback unit 440 has the phase of the recovered clock CLK_RECOVERED lagging can be obtained.

Figure 5:
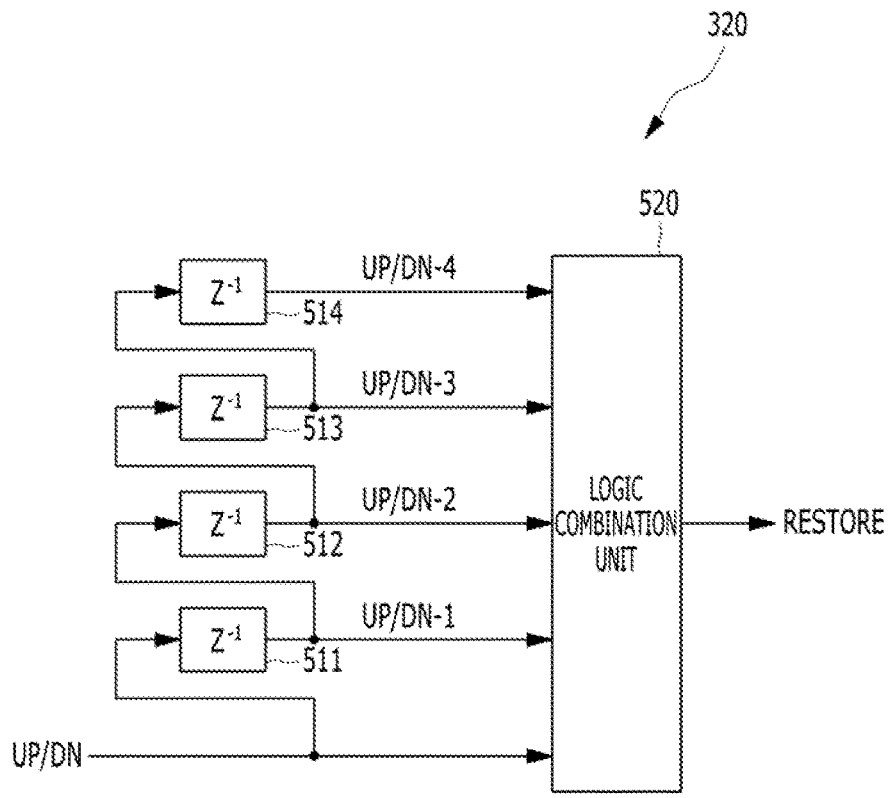
FIG. 5 is a diagram illustrating of a restoration signal' generation unit shown in FIGS. 3 and 4.

FIG. 5 is a diagram illustrating the restoration signal generation unit shown in FIGS. 3 and 4.

Referring to FIG. 5, the restoration signal generation unit 320 may include blocks 511 to 514 configured to store previous values of the up/down signal UP/DN and a logic combination unit 520.

The blocks 511 to 514 may store previous values of the up/down signal UP/DN. Block 511 may store a 1-cycle-prior value "Up/DN-1" of the up/down signal UP/DN, which is 1 cycle prior to the current up/down signal UP/DN. Block 512 may store a 2-cycle-prior value "UP/DN-2" of the up/down signal UP/DN, which is 2 cycles prior to the current up/down signal UP/DN. Block 513 may store a 3-cycle-prior value "UP/DN-3" of the up/down signal UP/DN, which is 3 cycles prior to the current up/down signal UP/DN. Block 514 may store a 4-cycle-prior value "UP/DN-4" of the up/down signal UP/DN, which is 4 cycles prior to the current up/down signal UP/DN. Here, 'cycle' is intended to mean 'dock cycle.' Each of the blocks 511 to 514 may be a D flip-flop which operates in synchronization with a clock.

The logic combination unit 520 may enable the restoration signal RESTORE when all the output values "UP/DN-1" to "UP/DN-4" of the blocks 511 to 514 are the same and only a current value of the up/down signal UP/DN is different. That is, when the up/down signal UP/DN shifts like "UP"→"UP"→"UP"→"UP"→"DN" or "DN"→"DN"→"DN"→"DN"→"UP", the logic combination unit 520 may enable the restoration signal RESTORE.

FIGS. 6 to 9 are embodiments of the first stage 431, the second stage 432, and the third stage 433 when the processing circuit 430 is suitable for holding the processing result when the restoration signal RESTORE is enabled.

Figure 6:
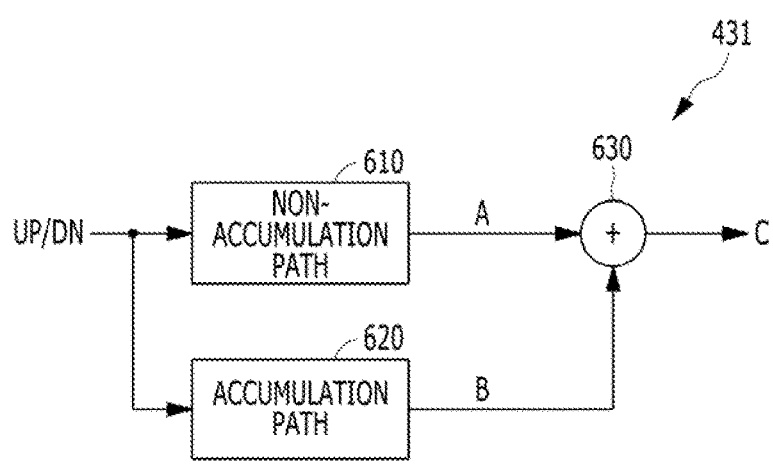
FIG. 6 is a diagram illustrating a first stage of a processing circuit shown in FIG. 4.

FIG. 6 is a diagram illustrating the first stage 431 of the processing circuit 430 shown in FIG. 4.

Referring to FIG. 6, the first stage 431 may include a non-accumulation path 610, an accumulation path 620, and a summer 630.

The non-accumulation path 610 may assign relatively high weight to the current value of the up/down signal UP/DN and output the weighted up/down signal UP/DN as a non-accumulation value "A". For example, when the weight of the non-accumulation path 610 is 10 and the up/down signal UP/DIN is indicative of the up signal, the non-accumulation path 610 may output the non-accumulation value "A" as +10. When the up/down signal UP/DN is indicative of the down signal, the non-accumulation path 610 may output the non-accumulation value "A" as −10.

The accumulation path 620 may assign relatively low weight to the current value of the up/down signal UP/DN and output the weighted up/down signal UP/DN as an accumulation value "B". For example, when the accumulation path 620 has a weight of 1, the accumulation path 620 may increase the accumulation value "B" by 1 whenever the up/down signal UP/DN indicative of the up signal is applied and may decrease the accumulation value B by 1 whenever the up/down signal UP/DN indicative of the down signal is applied.

The summer 630 may add up the non-accumulation value "A" and the accumulation value "B" and output a result of the adding-up as an added value "C".

The following Table 1 illustrates non-accumulation values "A", accumulation values "B", and added values "C" according to the up/down signal UP/DIN.

TABLE 1

|  | 1 CYCLE | 2 CYCLES | 3 CYCLES | 4 CYCLES | 5 CYCLES | 6 CYCLES |
|---|---|---|---|---|---|---|
| UP/DN | UP | UP | UP | UP | DN | DN |
| A | +10 | +10 | +10 | +10 | −10 | −10 |
| B | +1 | +2 | +3 | +4 | +3 | +2 |
| C | +11 | +12 | +13 | +14 | −7 | −8 |

From Table 1, it may be seen that an absolute value of the added value "C" becomes greater as the up signal "UP" or the down signal "DN" is consecutively accumulated, but becomes smaller when the up/down signal UP/DN shifts between the up signal "UP" and the down signal "DN". The first stage 431 can filter the up/dawn signal UP/DN through such an operation.

Figure 7:
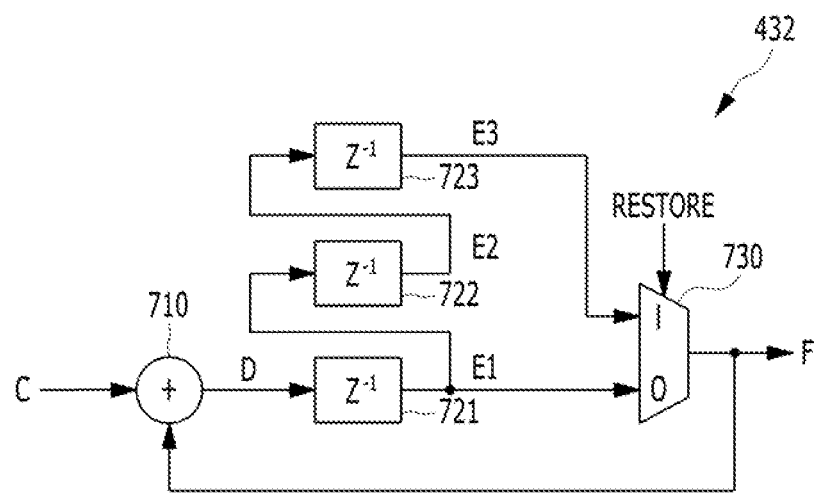
FIG. 7 is a diagram illustrating a second stage of the processing circuit shown in FIG. 4.

FIG. 7 is a diagram illustrating the second stage 432 of the processing circuit 430 shown in FIG. 4.

Referring to FIG. 7, the second stage 432 may include a summer 710, blocks 721 to 723, and a selector 730.

The summer 710 may sum up the added value "C" provided from the first stage 431, and a result value "F", that is, output of the second stage 432 to generate an output "D".

The block 721 may store the value of a previous cycle of output "D" of the summer 710. The block 722 may store the value of a previous cycle of output "E1" of the block 721. The block 723 may store the value of a previous cycle of output "E2" of the block 722.

When the restoration signal RESTORE is disabled, the selector 730 may output the output "E1" of the block 721 as the result value "F" of the second stage 432. When the restoration signal RESTORE is enabled, the selector 730 may output the output "E3" of the block 723 as the result value "F" of the second stage 432. That is, when the restoration signal RESTORE is enabled, the result value "F" of the second stage 432 may return to a 2-cycle-prior value "E3" of the added value "C", which is 2 cycles prior to the current added value "C".

The following Table 2 illustrates the operation of the second stage 432. In Table 2, value "F_1" shows the result value "F" when assuming the restoration signal RESTORE to be disabled while value "F_2" shows the result value "F" when assuming the restoration signal RESTORE to be enabled at the 5th clock cycle.

From Table 2, it may be seen that the added value "C" provided from the first stage 431 is reflected to the result value "F" of the second stage 432 with a delay of 1 cycle when assuming the restoration signal RESTORE to be disabled while the result value "F" returns to a 2-cycle-prior value when the restoration signal RESTORE is enabled at the 5th clock cycle.

Figure 8:
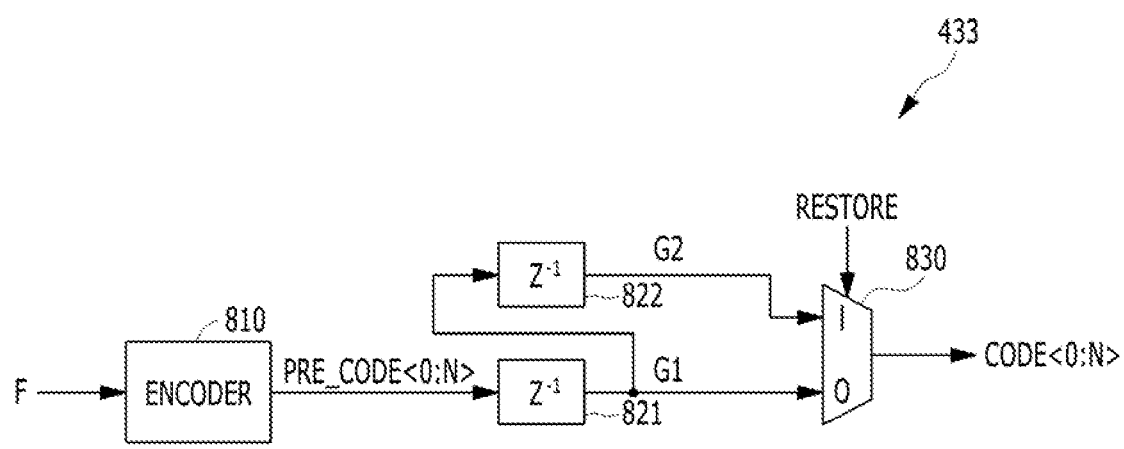
FIG. 8 is a diagram illustrating a third stage of the processing circuit shown in FIG. 4.

FIG. 8 is a diagram illustrating the third stage 433 of the processing circuit 430 shown in FIG. 4.

Referring to FIG. 8, the third stage 433 may include an encoder 810, blocks 821 and 822, and a selector 830.

The encoder 810 may convert the result value "F" of the second stage into preliminary control code PRE_CODE<0:N>. The result value "F" may correspond to a phase. For example, when the result value "F" ranges from 0 to 100, the range 0 to 100 may correspond to a phase range of 0° to 360°. A value 1 of the range 0 to 100 may represent a phase 3.6° of the phase range 0° to 360°. The encoder 810 may generate the preliminary control code PRE_CODE<0:N> so that the recovered clock CLK_RECOVERED has a phase corresponding to the result value "F". For example, when the result value "F" is 10, the encoder 810 may generate the preliminary control code PRE_CODE<0:N> so that the recovered clock CLK_RECOVERED has a phase of 36°.

The block 821 may store the value "G1" of a previous cycle of the preliminary control code PRE_CODE<0:N>. The block 822 may store the value "G2" of a previous cycle of the output "G1" of the block 821.

When the restoration signal RESTORE is disabled, the selector 830 may output the output "G1" of the block 821 as the control code CODE<0:N>. When the restoration signal RESTORE is enabled, the selector 830 may output the output "G2" of the block 822 as the control code CODE<0:N>.

The following Table 3 illustrates the operation of the third stage 433. In Table 3, value "F_1" shows the result value "F" when assuming the restoration signal RESTORE to be disabled while value "F_2" shows the result value "F" when assuming the restoration signal RESTORE to be enabled at the 5th clock cycle. When the restoration signal RESTORE is enabled, the control code CODE 0:N> may return to the 1-cycle-prior value of "G2" of the control code CODE<0:N>, which is 1 cycle prior to the result value "F".

TABLE 2

|  | 1 CYCLE | 2 CYCLES | 3 CYCLES | 4 CYCLES | 5 CYCLES | 6 CYCLES |
|---|---|---|---|---|---|---|
| C | +11 | +12 | +13 | +14 | −7 | −8 |
| D | +11 | +23 | +36 | +50 | +43 | +35 |
| F_1 | 0 | +11 | +23 | +36 | +50 | +43 |
| F_2 | 0 | +11 | +23 | +36 | +23 | +16 |

TABLE 3

|  | 1 CYCLE | 2 CYCLES | 3 CYCLES | 4 CYCLES | 5 CYCLES | 6 CYCLES |
|---|---|---|---|---|---|---|
| F_1 | 0 | +11 | +23 | +36 | +50 | +43 |
| PRE_CODE <0:N> | Code value corresponding to 0 | Code value corresponding to +11 | Code value corresponding to +23 | Code value corresponding to +36 | Code value corresponding to +50 | Code value corresponding to +43 |
| CODE <0:N> | Code value corresponding to 0 | Code value corresponding to 0 | Code value corresponding to +11 | Code value corresponding to +23 | Code value corresponding to +36 | Code value corresponding to +50 |
| F_2 | 0 | +11 | +23 | +36 | +23 | +16 |
| PRE_CODE <0:N> | Code value corresponding to 0 | Code value corresponding to +11 | Code value corresponding to +23 | Code value corresponding to +36 | Code value corresponding to +23 | Code value corresponding to +16 |
| CODE <0:N> | Code value corresponding to 0 | Code value corresponding to 0 | Code value corresponding to +11 | Code value corresponding to +23 | Code value corresponding to +23 | Code value corresponding to +23 |

From Table 3, it may be seen that the result value "F" provided from the second stage 432 is reflected to the control code CODE<0:N> with a delay of 1 cycle when assuming the restoration signal RESTORE to be disabled while the control code CODE<0:N> returns to the 1-cycle-prior value and the result value "F" returns to the 2-cycle-prior value when the restoration signal RESTORE is enabled at the 5th clock cycle.

FIG. 9 is a diagram illustrating an entire operation of the processing circuit 430 shown in FIGS. 6 to 8. FIG. 9 illustrates that the restoration signal RESTORE is enabled at the 5th clock cycle when the enablement condition of the restoration signal RESTORE is satisfied.

From FIG. 9, the result value "F" of the second stage 432 is changed into the 2-cycle-prior value "+23" in response to the enabled restoration signal RESTORE at the 5th clock cycle, and the control code CODE<0:N> that is output of the third stage 433 is changed into the 1-cycle-prior code value corresponding to "+23". It may also be seen that as a result, the value of the control code CODE<0:N> is held to the code value corresponding to "+23" at 5th to 6th clock cycles.

Figure 10:
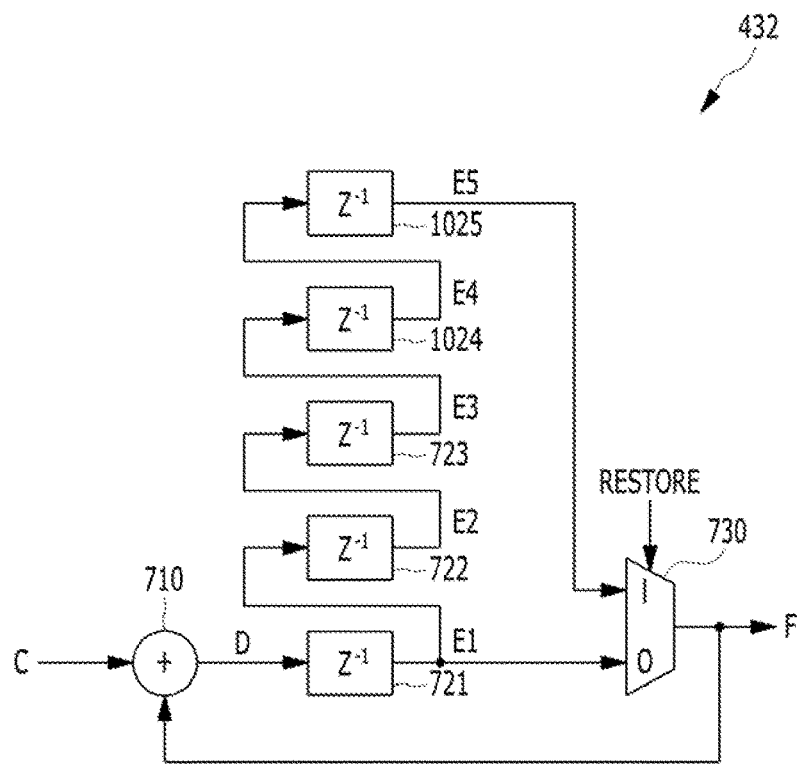
FIG. 10 is a diagram illustrating a second stage of the processing circuit shown in FIG. 4.
Figure 11:
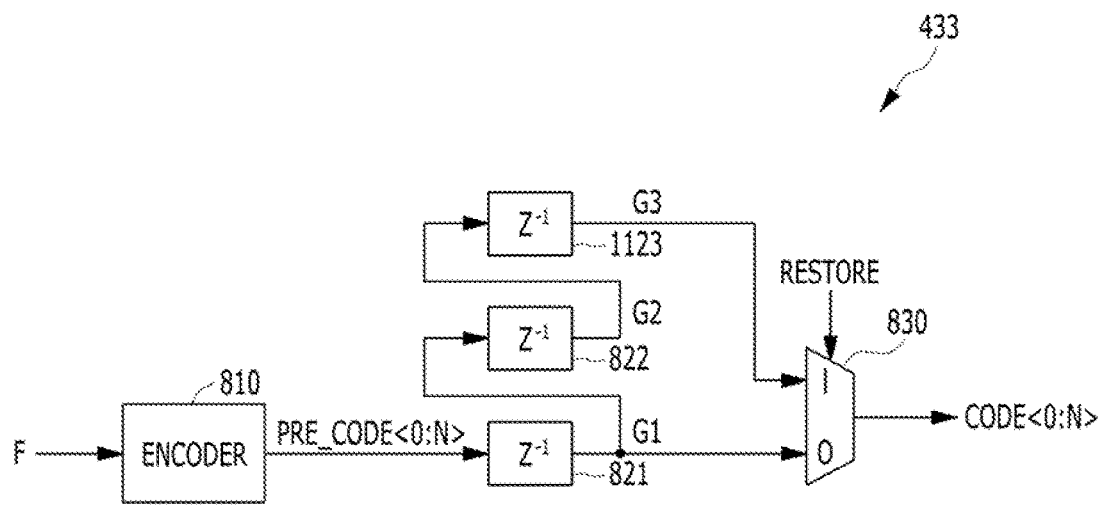
FIG. 11 is a diagram illustrating a third stage of the processing circuit shown in FIG. 4.

FIGS. 10 to 12 are diagrams illustrating embodiments of the second stage 432 and the third stage 433 when the processing circuit 430 is suitable for restoring the process result of the processing circuit 430 to the previous value when the restoration signal is enabled. The first stage 431 may be the same as described with reference to FIG. 6.

FIG. 10 is a diagram illustrating the second stage 432 of the processing circuit 430 shown in FIG. 4.

Referring to FIG. 10, the second stage 432 may include a summer 710, blocks 721 to 723, 1024, and 1025, and a selector 730. The second stage 432 shown in FIG. 10 may be the same as the second stage 432 described with reference to FIG. 7 except for the blocks 1024 and 1025.

Block 1024 may store the value of a previous cycle of the output "E3" of the block 723. Block 1025 may store the value of a previous cycle of output "E4" of the block 1024. Furthermore, when the restoration signal RESTORE is enabled, the selector 730 may output the output "E5" of block 1025 as the result value "F" of the second stage 432.

When the restoration signal RESTORE is enabled, the result value "F" of the second stage 432 may return to a 4-cycle-prior value "E5" of the added value "C", which is 4 cycles prior to the current added value "C".

FIG. 11 is a diagram illustrating the third stage 433 of the processing circuit 430 shown in FIG. 4.

Referring to FIG. 11, the third stage 433 may include an encoder 810, blocks 821, 822, and 1123, and a selector 830.

The third stage 433 shown in FIG. 11 may be the same as the third stage 433 described with reference to FIG. 8 except for block 1123.

Block 1123 may store the value "G3" of a previous cycle of the output "G2" of block 822. Furthermore, when the restoration signal RESTORE is enabled, the selector 830 may output the output "G3" of block 1123 as the control code CODE<0:N>.

When the restoration signal RESTORE is enabled, the control code CODE<0:N> may return to the 2-cycle-prior value of "G3" of the control code CODE<0:N>, which is 2 cycles prior to the result value "F".

FIG. 12 is a diagram illustrating the entire operation of the processing circuit shown in FIGS. 10 to 11. FIG. 12 illustrates that the restoration signal RESTORE is enabled at the 5th clock cycle when the enablement condition of the restoration signal RESTORE is satisfied.

From FIG. 12, result value "F" of the second stage 432 changes into the 4-cycle-prior value "0" in response to the enabled restoration signal RESTORE at the 5th clock cycle, and the control code CODE<0:N> that is output of the third stage 433 changes into the 2-cycle-prior code value corresponding to "+11". It may also be seen that as a result, the value of the control code CODE<0:N> starts to decrease from the 5th clock cycle.

Figure 13:
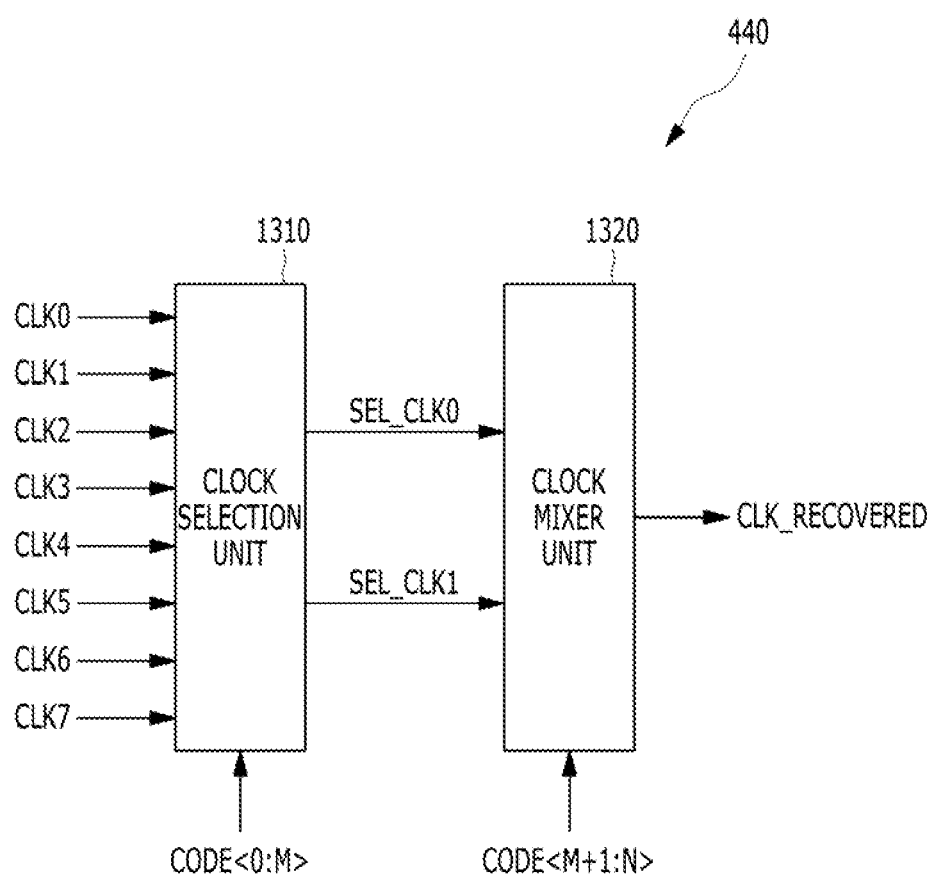
FIG. 13 is a diagram illustrating a phase interpolator shown in FIG. 4.

FIG. 13 is a diagram illustrating a phase interpolator shown in FIG. 4.

Referring to FIG. 13, the phase interpolator 440 may include a clock selection unit 1310 and a clock mixer unit 1320.

The clock selection unit 1310 may output two of the multi-phase clocks CLK0 to CLK7 as selected clocks SEL_CLK0 and SEL_CLK1 in response to bits CODE<0:M> of the control code CODE<0:N> (M<N).

The clock mixer unit 1320 may generate the recovered clock CLK_RECOVERED by composing the selected clocks SEL_CLK0 and SEL_CLK1. The clock mixer unit 1320 may compose the selected clocks SEL_CLK0 and SEL_CLK1 at a composite ratio determined by the remaining bits CODE<M+1:N> of the control code CODE<0:N>. The recovered clock CLK_RECOVERED has a phase between the selected clock SEL_CLK0 and the selected clock SEL_CLK1, and the phase may be determined based on the composite ratio.

In accordance with embodiments of the present invention, a bang-bang error of an integrated circuit using a feedback scheme can be reduced.

Although various embodiments slave been described for illustrative purposes, it will be apparent to those skilled in the art that various changes and modifications may be made without departing from the spirit and scope of the invention as defined in the following claims.

What is claimed is:

1. A clock data recovery circuit, comprising:
a phase comparator that compares a phase of a recovered clock with a phase of received data to generate an up/down signal;
a restoration signal generation unit that enables a restoration signal when the up/down signal indicates up for a time greater than or equal to a first specific time and changes to indicate down afterwards, or when the up/down signal indicates down for the time greater than or equal to the first specific time and changes to indicate up afterwards;
a processing circuit including one or more stages for sequentially processing the up/down signal, wherein a last one of the one or more stages holds a process result thereof for a second specific time when the restoration signal is enabled; and
a phase interpolator that generates the recovered clock in response to the process result of the last stage,
wherein the processing circuit comprises:
a first stage including:
a non-accumulation path that generates a non-accumulation value in response to the up/down signal,
an accumulation path that generates an accumulation value in response to the up/down signal, and
an adder that outputs an added value of the non-accumulation value and the accumulation value;
a second stage that accumulates the added value and outputs the accumulated value as a result value; and
a third stage that generates a control code for controlling the phase interpolator so that the phase interpolator generates the recovered clock having a phase corresponding to the result value of the second stage.

2. The clock data recovery circuit of claim 1,
wherein the second stage changes the result value to a value prior to 2 cycles when the restoration signal is enabled, and
wherein the third stage holds the control code when the restoration signal is enabled.

3. The clock data recovery circuit of claim 1, wherein the phase interpolator generates the recovered clock by composing two clocks of first to N-th multi-phase clocks (N is an integer of 3 or more).

4. A clock data recovery circuit, comprising:
a phase comparator that compares a phase of a recovered clock with a phase of received data to generate an up/down signal;
a restoration signal generation unit that enables a restoration signal when the up/down signal indicates up for a time greater than or equal to a specific time and changes to indicate down afterwards, or when the up/down signal indicates down for the time greater than or equal to the specific time and changes to indicate up afterwards;
a processing circuit including one or more stages for sequentially processing the up/down signal, wherein a last one of the one or more stages restores a process result thereof to a previous value when the restoration signal is enabled; and
a phase interpolator that generates the recovered clock in response to the process result of the last stage,
wherein the processing circuit comprises:
a first stage including:
a non-accumulation path that generates a non-accumulation value in response to the up/down signal,
an accumulation path that generates an accumulation value in response to the up/down signal, and
an adder that outputs an added value of the non-accumulation value and the accumulation value;
a second stage that accumulates the added value and outputs the accumulated value as a result value; and
a third stage that generates a control code for controlling the phase interpolator so that the phase interpolator generates the recovered clock having a phase corresponding to the result value of the second stage.

5. The clock data recovery circuit of claim 4,
wherein the second stage changes the result value to a result value prior to 2 cycles when the restoration signal is enabled, and
wherein the third stage changes the control code to a control code value prior to two cycles when the restoration signal is enabled.

6. The clock data recovery circuit of claim 4, wherein the phase interpolator generates the recovered clock by composing two clocks of first to N-th multi-phase clocks (N is an integer of 3 or more).

* * * * *